United States Patent [19]

Kaufman

[11] Patent Number: 4,860,164
[45] Date of Patent: Aug. 22, 1989

[54] HEAT SINK APPARATUS WITH ELECTRICALLY INSULATIVE INTERMEDIATE CONDUIT PORTION FOR COOLANT FLOW

[76] Inventor: Lance R. Kaufman, 8001 N. Mohave, Paradise Valley, Ariz. 85253

[21] Appl. No.: 239,623

[22] Filed: Sep. 1, 1988

[51] Int. Cl.⁴ .............................................. H05K 7/20
[52] U.S. Cl. .................................. 361/388; 165/80.4; 174/15.1; 361/385
[58] Field of Search .................... 165/80.2, 80.3, 80.4, 165/104.33; 174/15.1, 15.2; 361/382, 383, 385, 386, 388; 357/81, 82

[56] References Cited

U.S. PATENT DOCUMENTS

| | | |
|---|---|---|
| 2,992,372 | 7/1961 | Himeon et al. |
| 3,437,132 | 4/1969 | Venema |
| 3,651,865 | 3/1972 | Feldmanis |
| 3,744,120 | 7/1973 | Burgess et al. |
| 3,766,634 | 10/1973 | Babcock et al. |
| 3,794,886 | 2/1974 | Goldman |
| 3,854,892 | 12/1974 | Burgess et al. |
| 3,911,553 | 10/1975 | Burgess et al. |
| 3,993,411 | 11/1976 | Babcock et al. |
| 3,994,430 | 11/1976 | Cusano et al. |
| 4,106,188 | 8/1978 | Sekhon et al. |
| 4,129,243 | 12/1978 | Cusano et al. |
| 4,327,399 | 4/1982 | Sasaki et al. |
| 4,361,717 | 11/1982 | Gilmore et al. |
| 4,631,636 | 12/1986 | Andrews .............................. 361/385 |
| 4,697,205 | 9/1987 | Eastman |

OTHER PUBLICATIONS

"Over 50 Years of Experience With the Direct Bond Copper Process", Tegmen Corp., 1201 East Fayette Street, Syracuse, N.Y. 13210.

Primary Examiner—Gerald P. Tolin
Attorney, Agent, or Firm—Andrus, Sceales, Starke & Sawall

[57] ABSTRACT

Heat sink cooling apparatus (4) includes a conduit (8) having an electrically conductive first portion (10) providing a first electrical terminal, an electrically conductive second portion (12) providing a second electrical terminal, and an electrically insulative intermediate portion (14) between and electrically isolating the first and second portions (10 and 12). The conduit (8) has an internal passage (16) receiving coolant (18) flowing therethrough including through the first and second portions (10 and 12) and the intermediate portion (14) therebetween. A heat generating electric current conducting component (6) is mounted on the first conduit portion and connected by an electrical conductor (26) to the second conduit portion (12) such that electric current flows through the component (6) and the conductor (26) between the first and second conduit portions (10 and 12) providing the main electrical terminals. The intermediate conduit portion (14) prevents a short circuit between the main terminals. Coolant (18) flowing through the conduit (8) cools the electric component (6) mounted to the first conduit portion (10).

4 Claims, 1 Drawing Sheet

HEAT SINK APPARATUS WITH ELECTRICALLY INSULATIVE INTERMEDIATE CONDUIT PORTION FOR COOLANT FLOW

BACKGROUND AND SUMMARY

The invention relates to heat sink cooling apparatus for electric current conducting components including semiconductor chips and the like.

It is known in the art to mount current conducting electric components on a heat sink having a passage through which coolant flows to cool the electric component. It is also known to use the cooled heat sink member itself for conducting current to the electric component, i.e. using the coolant passage conduit itself as an electrical terminal.

The present invention provides a heat sink with a cooling conduit which itself provides both of the electrical terminals for the electric component.

DETAILED DESCRIPTION

Figure 1:
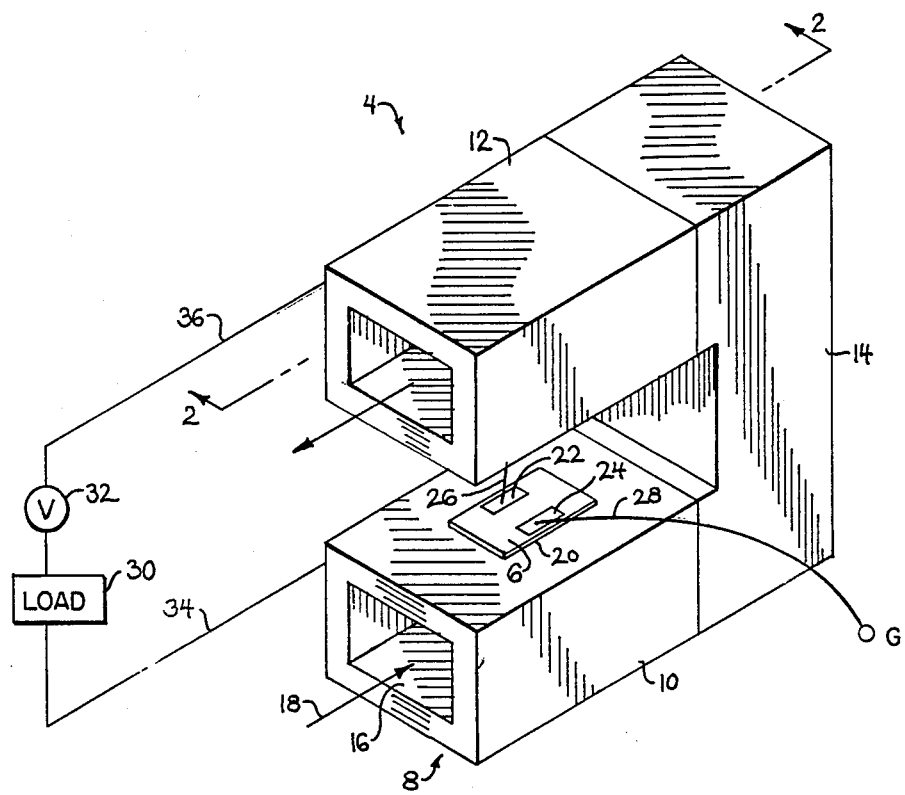
FIG. 1 is a perspective view illustrating heat sink cooling apparatus in accordance with the invention.
Figure 2:
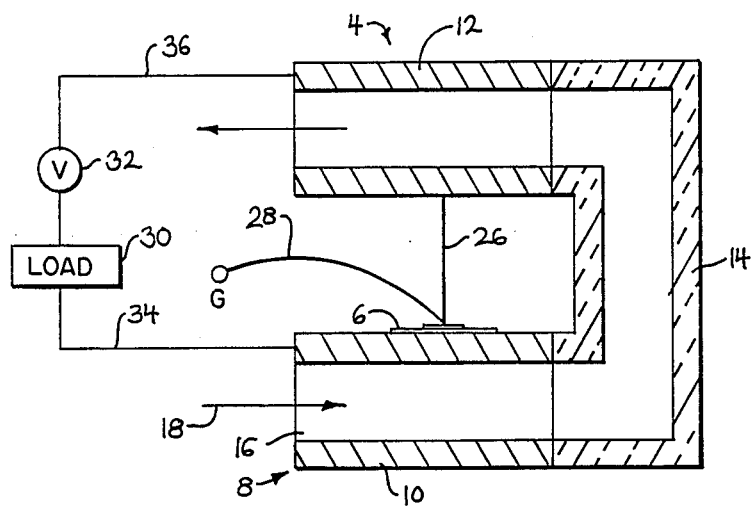
FIG. 2 is a sectional view taken along line 2—2 of FIG. 1.

FIGS. 1 and 2 show heat sink cooling apparatus 4 for an electric current conducting component 6, for example a semiconductor chip such as a transistor, thyristor, etc. A conduit 8 has an electrically conductive first portion 10 providing a first electrical terminal, an electrically conductive second portion 12 providing a second electrical terminal, and an electrically insulative intermediate portion 14 between and electrically isolating portions 10 and 12. Conduit 8 has an internal passage 16 receiving coolant 18, in liquid or gaseous form, flowing therethrough, entering through portion 10, and then flowing through portion 14, and then exiting through portion 12.

In one embodiment, component 6 is a FET, field effect transistor, chip having a bottom drain contact pad 20 mounted by soldering or the like to the upper surface of conduit portion 10, an upper source contact pad 22 and an upper gate contact pad 24. Electrical conductor wire 26 is connected between source contact pad 22 and the bottom surface of conduit portion 12. Electrical conductor wire 28 is connected to gate contact pad 24 and provides a gating terminal to gate the FET into conduction and complete a circuit through load 30 and voltage source 32. Current flows from voltage source 32 through load 30 through conductor wire 34 to conduit portion 10 providing a first main electrical terminal, then through FET 6 and conductor 26 to conduit portion 12 providing a second main electrical terminal, and then back through conductor wire 36 to voltage source 32. Electrically insulative intermediate conduit portion 14 prevents a short circuit between electrically conductive conduit portions 10 and 12 providing the electrical terminals. Coolant 18 flowing through conduit 8 cools electric component 6 mounted to conduit portion 10.

Conduit 8 is a U-shaped member having a pair of legs joined by a central bight. The legs provide conduit portions 10 and 12, and the bight provides intermediate conduit portion 14.

Intermediate conduit portion 14 is an electrically insulating thermally conductive nonmetallic refractory ceramic member. Conduit portions 10 and 12 are copper members directly bonded to intermediate portion 14.

Direct bonding of copper to ceramic is known in the art, for example U.S. Pat. Nos. 3,766,634, 3,993,411, 3,994,430, 3,911,553, 3,744,120, 3,854,892, 4,129,243, incorporated herein by reference. References also made to allowed U.S. application Ser. No. 07/120,626, filed Nov. 13, 1987, incorporated herein by reference. Copper conduit portions 10 and 12 are placed in contact with ceramic conduit portion 14, and conduit portions 10, 12 and 14 are heated to a temperature below the melting point of copper conduit portions 10 and 12 to form a eutectic with copper conduit portions 10 and 12 which wets copper conduit portions 10 and 12 and ceramic conduit portion 14, whereafter conduit portions 10, 12 and 14 are cooled, with copper conduit portions 10 and 12 bonded to ceramic conduit portion 14. In one embodiment, copper conduit portions 10 and 12 are preoxidized, and the heating is done in an inert atmosphere. In another embodiment, the heating is done in a reactive oxygen gas atmosphere.

It is recognized that various equivalents, alternatives and modifications are possible within the scope of the appended claims.

I claim:

1. Heat sink cooling apparatus for an electric current conducting component, comprising a conduit having an electrically conductive first portion providing a first electrical terminal, an electrically conductive second portion providing a second electrical terminal, and an electrically insulative intermediate portion between and electrically isolating said first and second portions, said conduit having an internal passage receiving coolant flowing therethrough including through said first and second portions and said intermediate portion therebetween, a heat generating electric current conducting component mounted on said first conduit portion, an electrical conductor connected between said electric component and said second conduit portion to provide an electric circuit path through said component and said conductor between said first and second conduit portions providing first and second electrical terminals, and wherein said intermediate conduit portion prevents a short circuit between said first and second terminals, and wherein coolant flowing through said conduit cools said electric component mounted to said first conduit portion.

2. The invention according to claim 1 wherein said conduit is a U-shaped member having a pair of legs joined by a central bight, wherein said legs provide said first and second conduit portions, and said bight provides said intermediate conduit portion.

3. The invention according to claim 1 wherein said intermediate conduit portion is an electrically insulating nonmetallic member, and said first and second conduit portions are electrically conductive metallic members directly bonded to said intermediate portion by placing said first and second conduit portions in contact with said intermediate conduit portion, heating said first and second and intermediate conduit portions to a temperature below the melting point of said first and second conduit portions to form a eutectic with said first and second conduit portions which wets said first and second and intermediate conduit portions, and cooling said first and second and intermediate conduit portions, with said first and second conduit portions bonded to said intermediate conduit portion.

4. The invention according to claim 3 wherein said intermediate conduit portion is ceramic, and said first and second conduit portions are copper.

* * * * *